(12) United States Patent
Lin et al.

(10) Patent No.: US 7,538,406 B2
(45) Date of Patent: May 26, 2009

(54) AMBIENT LIGHT SENSOR UTILIZING COMBINATION OF FILTER LAYER AND ABSOPRTION LAYER TO ACHIEVE SIMILAR SENSITIVITY TO THE LIGHT AS THE HUMAN EYE

(75) Inventors: Hao-Hsiung Lin, Taipei (TW); Ta-Chun Ma, Taipei (TW); Yu-Ru Lin, Taipei (TW); Jyun-Ping Wang, Taipei (TW); Cheng-Hong Huang, Taipei (TW)

(73) Assignee: National Taiwan University, Taipei (TW)

( * ) Notice: Subject to any disclaimer, the term of this patent is extended or adjusted under 35 U.S.C. 154(b) by 30 days.

(21) Appl. No.: 11/744,384

(22) Filed: May 4, 2007

(65) Prior Publication Data

US 2008/0179701 A1    Jul. 31, 2008

(30) Foreign Application Priority Data

Jan. 30, 2007    (TW) .............................. 96103337 A

(51) Int. Cl.
*H01L 31/0248*    (2006.01)

(52) U.S. Cl. ............................... 257/458; 257/E31.061

(58) Field of Classification Search .................. 257/458, 257/E31.002, 656, 14, 184, 432, 17
See application file for complete search history.

(56) References Cited

U.S. PATENT DOCUMENTS

| 3,881,113 | A | * | 4/1975 | Rideout et al. ............... 250/551 |
| 5,872,016 | A | * | 2/1999 | Cunningham et al. ......... 438/37 |
| 7,174,080 | B2 | * | 2/2007 | Walker ........................ 385/131 |
| 2005/0072908 | A1 | * | 4/2005 | Grunert et al. .............. 250/226 |

* cited by examiner

*Primary Examiner*—Evan Pert
*Assistant Examiner*—Selim Ahmed
(74) *Attorney, Agent, or Firm*—WPAT, P.C.; Anthony King

(57) ABSTRACT

An ambient light sensor includes a substrate, a buffer layer formed on the substrate, an absorption layer formed on the buffer layer for absorbing the visible light, and a filter layer formed on the absorption layer for filtering infrared light and high-energy photon insensitive to human eye. The absorption layer is a PIN junction having a compositional graded intrinsic layer. The peak wavelength of responsivity spectrum of the ambient light sensor is very close to that of human eye.

15 Claims, 2 Drawing Sheets

AMBIENT LIGHT SENSOR UTILIZING COMBINATION OF FILTER LAYER AND ABSOPRTION LAYER TO ACHIEVE SIMILAR SENSITIVITY TO THE LIGHT AS THE HUMAN EYE

BACKGROUND OF THE INVENTION

1. Field of the Invention

The present invention relates generally to a light sensor, and in particular to an ambient light sensor.

2. The Prior Arts

A conventional ambient light sensor has similar sensitivity to the light as human eye. The responsivity spectrum of the ambient light sensor to light of different wavelengths is very close to the CIE standard photopic luminosity function (V(λ)) with a peak at wavelength 555 nm.

In recent years, as displays and mobile communication devices are widely used, the ambient light sensor is attracting more attention. The conventional ambient light sensor is mainly used to detect ambient background light. The detected signals are processed for adjusting brightness and contrast of the display devices. The ambient light sensor not only can provide the best visual perception to the users for relieving the eyestrain but also save power consumption of the display device for prolonging the operation time of the mobile device and extending the operating life of the display device.

Otherwise, color output has become the basic requirement of the display. However, the color screen leads to greater power consumption, which shortens the battery life of the mobile device. Furthermore, due to the users in motion, the amount of ambient light varies, thus it needs to adjust the power of the backlights in the display according to the brightness of surroundings, thereby providing the proper brightness for viewing. If the power of the backlight in the display can be adjusted according to the ambient light detected by the ambient light sensor, the illumination can match with ambient brightness. It not only improves the visual quality, but also greatly reduces the power consumption of mobile phones or PDA's. It is estimated that the power saved is up to 40%, thereby extending the operating life of the mobile device.

Conventional methods for manufacturing the ambient light sensor for detecting the ambient light are usually classified into three categories. The first method uses silicon-based material to manufacture the ambient light sensor, which has the advantage of integrating the ambient light sensor with the post amplifier and the signal processing IC. However, using the silicon-based material results in the limitation of the detection location and the deviation of the detection results due to absorbing the infrared light that is difficult to eliminate. To resolve the problem, one of solutions is using a special filter to filter the infrared light. Another solution is using a pair of sensors to respectively absorb light with different wavelengths and then processing the signals, thereby eliminating the absorbed infrared light. Even though provided with these solutions, the response spectrum of the sensor is still different from that of the human eye. Thus the sensor can't see the way the human eye does.

The second method integrates the ambient light sensor with the display panel. That is, when using the amorphous silicon thin film transistor (a-Si TFT) to manufacture a liquid crystal display panel, the ambient light sensor and the liquid crystal display panel are manufactured at the same time. Or when manufacturing an organic light-emitting diode panel, the material for manufacturing organic light-emitting diode is used to manufacture the ambient light sensor at the same time. However, this method needs to directly change the design of the panel so that it needs to change the manufacturing process of the panel. At present, this method is only used in the handwriting panel, and is still unable to be used in the ambient light sensor.

In order to overcome the disadvantages of the conventional methods for manufacturing the ambient light sensor described above, a third method is proposed. It uses a material without integrating with any silicon chip or panel, and manufactures the ambient light sensor separately. This method uses a material, which absorbs the light with the wavelength range close to the human eye does, to manufacture the light sensor so as to have a spectral sensitivity similar to that of the human eye. In theory, the ambient light sensor manufactured by this method is more stable and balance in detecting the ambient light, and thus different from the ambient light sensor made of the silicon-based material, which has responsivity spectrum for some light different from that of the human eye. Furthermore, the ambient light sensor made by this method is an independent component, which has characteristics very close to that of the human eye, and it can omits the signal calibration and processing. Thus, the light sensor does not need a lot of components, so its manufacturing cost is lower than that of the conventional ambient light sensors. In addition, the panel and the ambient light sensor are manufactured separately, so it does not need to redesign the panel. The design of the whole system is more flexible. Thus, many manufacturers dedicate themselves to this method for manufacturing the ambient light sensor, which is sensitive to wave range of light close to that of the human eye.

SUMMARY OF THE INVENTION

A primary objective of the present invention is to provide an ambient light sensor, which does not absorb infrared light and has spectral response peak at the same wavelength as the human eye does.

Another objective of the present invention is to provide an ambient light sensor, whose structure is simple in order to lower the manufacturing cost.

An ambient light sensor according to the present invention includes a substrate, a buffer layer formed on the substrate, an absorption layer formed on the buffer layer, and a filter layer formed on the absorption layer. The absorption layer absorbs the visible light. The absorption layer is a PIN (P-type-Intrinsic-N-type) junction, and the material of the absorption layer is $Al_xGa_{1-x}As$ (0<x<1). The absorption layer comprises an intrinsic layer, and the material of the intrinsic layer is $Al_yGa_{1-y}As$ (0<y<1) wherein y gradually changes from 0 to 1. The filter layer filters the infrared light and high-energy light invisible to the human eyes.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
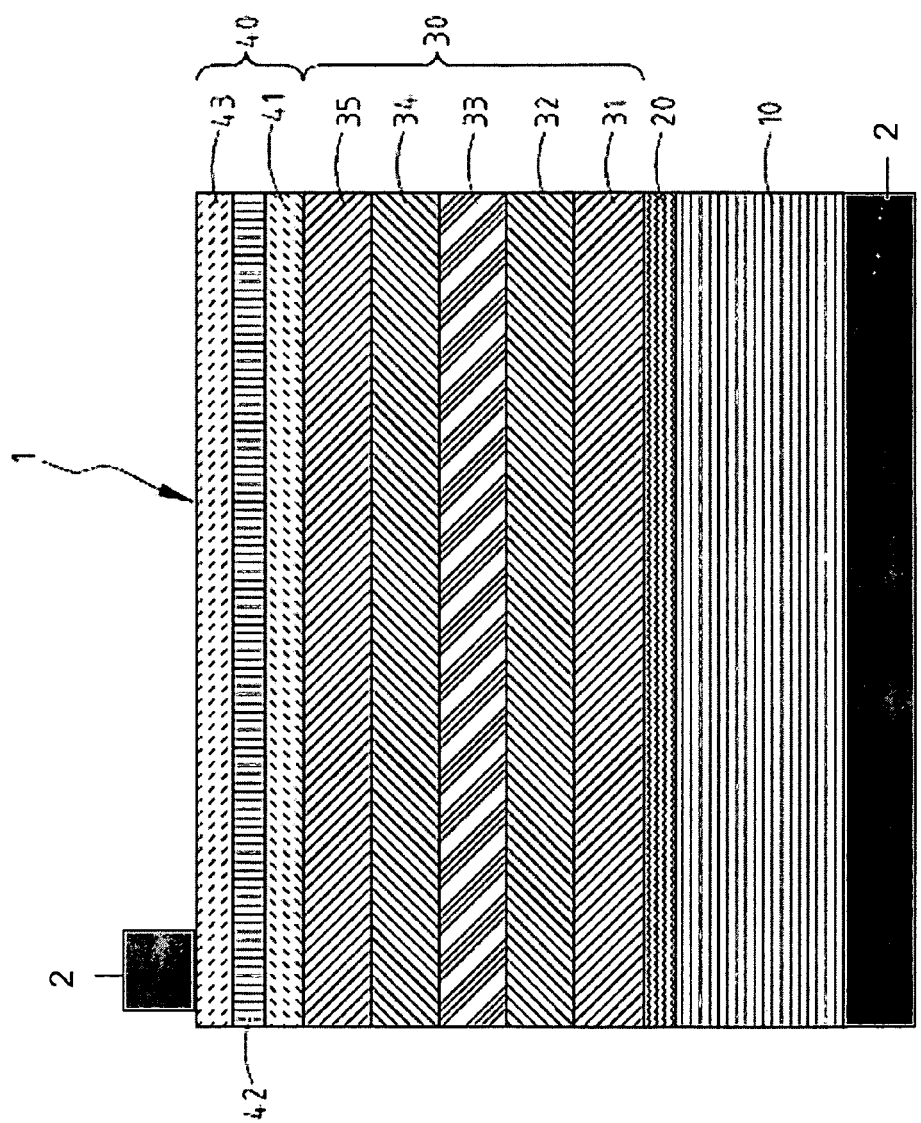
FIG. 1 is a cross-section view showing an ambient light sensor according to the present invention.

Referring to FIG. 1, an ambient light sensor 1 according to the present invention includes a substrate 10, a buffer layer 20 formed on the substrate 10, an absorption layer 30 formed on the buffer layer 20 for absorbing the light visible to the human eye, and a filter layer 40 formed on the absorption layer 30 for eliminating the infrared light.

The absorption layer 30 of the ambient light sensor 1 according to the present invention is a component of a PIN light sensor. The absorption layer 30 further comprises a first absorption sub-layer 31, a second absorption sub-layer 32, a third absorption sub-layer 33, a fourth absorption sub-layer 34 and a fifth absorption sub-layer 35 formed on the buffer layer 20 in sequence, that is, the first absorption sub-layer 31 directly contacts with the buffer layer 20. The material of the first absorption sub-layer 31, the second absorption sub-layer 32, the fourth absorption sub-layer 34 and the fifth absorption sub-layer 35 is Aluminum Gallium Arsenide, which is expressed as the molecular formula $Al_xGa_{1-x}As$. The x in the molecular formula is a number between 0 and 1. The preferred x value is between 0.2 and 0.8, and the more preferred x value is between 0.4 and 0.65. The third absorption sub-layer 33 is an intrinsic layer. The third absorption sub-layer 33 is a compositional graded layer, and is made of $Al_yGa_{1-y}As$ (0<y<1), where y gradually changes from 0 to 1. The preferred y value is from 0.3 to 0.8, and the more preferred y value is from 0.3 to 0.61.

The filter layer 40 may further comprises a first filter sub-layer 41, a second filter sub-layer 42, and a third filter sub-layer 43 forming on the absorption layer 30 in sequence, that is, the first filter sub-layer 41 contacts with the fifth absorption sub-layer 35 directly. Therein, the first filter sub-layer 41 and the third filter sub-layer 43 are made of GaAs or AlGaAs, which contains less Al than the fifth absorption sub-layer 35 does. The second filter sub-layer 42 is made of $Al_zGa_{1-z}As$ (0<z<1). The preferred z value is between 0.6 and 0.8, and the more preferred z value is between 0.7 and 0.75.

The filter layer 40 and the substrate 10 are P-type doping or N-type doping respectively, and have different doping types from each other. Additionally, the first absorption sub-layer 31 and the fifth absorption sub-layer 35 are P-type doping or N-type doping respectively, and have different doping types from each other. The fifth absorption sub-layer 35 has the same doping type as the filter layer 40, and the substrate 10, the buffer layer 20 and the first absorption sub-layer 31 have the same doping type. The second absorption sub-layer 32, the third absorption sub-layer 33 and the fourth absorption sub-layer 34 do not have doping. For example, as the substrate 10 is N-type doping, the buffer layer 20 and the first absorption sub-layer 31 are N-type doping, and the fifth absorption sub-layer 35 and the filter layer 40 are P-type doping. On the other way, as the substrate 10 is P-type doping, the buffer layer 20 and the first absorption sub-layer 31 are P-type doping, and the fifth absorption sub-layer 35 and the filter layer 40 are N-type doping. Both the third filter sub-layer 43 and the substrate 10 are contact surfaces of bias electrodes 2.

In the ambient light sensor 1 according to the present invention, the energy gap of the first filter sub-layer 41 is smaller than that of the fifth absorption layer 35. Thus the minority carriers, which are generated from the photons absorbed by the filter layer 40, are blocked by the difference of the energy gaps between the first filter sub-layer 41 and the fifth absorption sub-layer 35, and cannot be converted into photocurrent. Only the carriers, which are generated from the photons absorbed by the absorption layer 30, can be converted into photocurrent. The shorter the wavelength of the photons is, the more easily the photons is absorbed by the filter layer 40, and the shallower the depth of the filter layer 40 the photons can penetrate. Therefore, if the thickness of the filter layer 40 increases, the amount of the photons arriving at the absorption layer 30 reduces. The attenuation of high-energy photons (short-wavelength light) is more significant than that of low-energy photons (long-wavelength light). Thus, increasing the thickness of the filter layer 40 not only lowers the responsivity of the ambient light sensor 1 according to the present invention but also moves the peak of the responsivity spectrum toward the infrared light range (red shift). On the other way, if the thickness of the filter layer 40 decreases, the amount of light arriving at the absorption layer 30 increases. Thus, the responsivity of the ambient light sensor 1 according to the present invention increases, and the peak of the responsivity spectrum moves toward the ultraviolet region (blue shift). Therefore, the thickness of the filter layer 40 affects the location of the peak of the responsivity spectrum of the ambient light sensor 1 according to the present invention, and the magnitude of the responsivity. The preferred thickness of the filter layer 40 is within 50~500 nm range so that the ambient light sensor 1 according to the present invention can have the spectral response peaking at the same wavelength as the human eye.

The compositional graded layer of the absorption layer 30 effectively enhances the absorption of the long-wavelength light, and effectively overcomes the disadvantage that the ambient light sensor manufactured by a uniform composition has a lower responsivity than that of the human eye in that range. On the other hand, the filter layer 40 uses GaAs and effectively eliminates the response to the infrared light. Furthermore, there is a high-energy-gap layer of AlGaAs formed between layers of GaAs in the absorption layer 30. Therefore, the photons from the light absorbed by the filter layer 40 can not convert to the photocurrent due to the energy gap barrier formed by the absorption sub-layer 35, thereby filtering the high energy photons, adjusting the upper energy limit of the photons absorbed by the ambient light sensor 1, and having the responsivity of the light close to the human eye within the short wavelength range.

The ambient light sensor 1 can effectively convert the ambient illumination into the photocurrent to output signals, and a post amplifier then processes the signals. The ambient light sensor 1 according to the present invention not only can be applied in the luminometer and in the intelligent device, such as a PDA, a mobile phone, a laptop, a display panel, etc, for adjusting the backlight.

The ambient light sensor 1 according to the present invention has a simple structure, and has the responsivity spectrum that is close to the CIE standard photopic luminosity function. Thus, the ambient light sensor 1 can solve the problem of infrared absorption that occurs in the detector manufactured by the silicon-based material. The ambient light sensor 1 according to the present invention can operate in precision only by a single component, so the post signal processing is an easy job.

The following is a description about the ambient light sensor 1 according to a preferred embodiment of the present invention. First of all, use a conventional epitaxial growth method to form the N-type doping GaAs substrate 10. Then, the N-type doping GaAs buffer layer 20, whose thickness is 100 nm and concentration is $10^{18}/cm^3$, is formed on the substrate 10. The absorption layer 30 is then formed on the buffer layer 20. The absorption layer 30 comprises five layers, which are the first absorption sub-layer 31, the second absorption sub-layer 32, the third absorption sub-layer 33, the fourth absorption sub-layer 34, and the fifth absorption sub-layer 35. The first absorption sub-layer 31 is made of N-type doping $Al_xGa_{1-x}As$ (x=0.61), whose thickness is 200 nm and concentration is $10^{18}/cm^3$; the second absorption sub-layer 32 is made of $Al_xGa_{1-x}As$ (x=0.61) without doping, whose thickness is 150 nm; the third absorption sub-layer 33 is made of $Al_yGa_{1-y}As$ without doping, whose thickness is 230 nm and y value changes from 0.3 to 0.61 gradually; the fourth absorption sub-layer 34 is made of $Al_xGa_{1-x}As$ (x=0.61) without doping, whose thickness is 150 nm; The fifth absorption sub-layer 35 is made of P-type doping $Al_xGa_{1-x}As$ (x=0.61), whose thickness is 200 nm and concentration is $10^{18}/cm^3$.

At last, the filter layer 40 is formed on the absorption layer 30. The filter layer 40 comprises three layers, which are the first filter sub-layer 41, the second filter sub-layer 42, and the third filter sub-layer 43. The first filter sub-layer 41 is made of P-type doping GaAs, whose thickness is 100 nm and concentration is $10^{18}/cm^3$; the second filter sub-layer 42 is made of P-type doping $Al_zGa_{1-z}As$ (z=0.73), whose thickness is 200 nm and concentration is $10^{18}/cm^3$; the third filter sub-layer 43 is made of P-type doping GaAs, whose thickness is 200 nm and concentration is $10^{18}/cm^3$. Thereby, the ambient light sensor 1 according to the present invention is manufactured.

After the manufacturing, the responsivity spectrum of the ambient light sensor 1 is measured on the needle probe translating stage. Light from a Tungsten-Halogen lamp is focused by two sets of lens and tuned by a chopper to a frequency of 250 Hz. A spectroscope (SPEX 500M) disperses the light to various monochromatic lights. Thus, the ambient light sensor 1 can absorb lights of different wavelengths, and convert lights to various photocurrents. Therefore, a current amplifier (Stanford Research SR570) amplifies and then converts the photocurrents into voltage signals. A lock-in amplifier (Stanford Research SR530) then detects and measures the voltage signals. Thus output signals from the ambient light sensor 1 are obtained.

A sample of the ambient light sensor 1 according to the present invention is calibrated with a standard silicon photodiode detector (Newport 818UV) to obtain the responsivity thereof, thereby obtaining the responsivity spectrum ($R_{PD}$) of the sample of the ambient light sensor 1. Because the ambient light sensor 1 sample and the standard Silicon photodiode detector have the same area size for absorbing the light, after being calibrated by the standard silicon photodiode detector, the absolute value of the responsivity of the ambient light sensor 1 sample can be correctly obtained. When measuring the responsivity spectrum, the current amplifier sets negative bias voltage at 2V and sensitivity at 1 µA/V.

The measured results of the ambient light sensor 1 according to the present invention show that the wavelength of the peak responsivity is 556 nm, the peak responsivity is 0.022 A/W, and the half-width is 101 nm.

Figure 2:
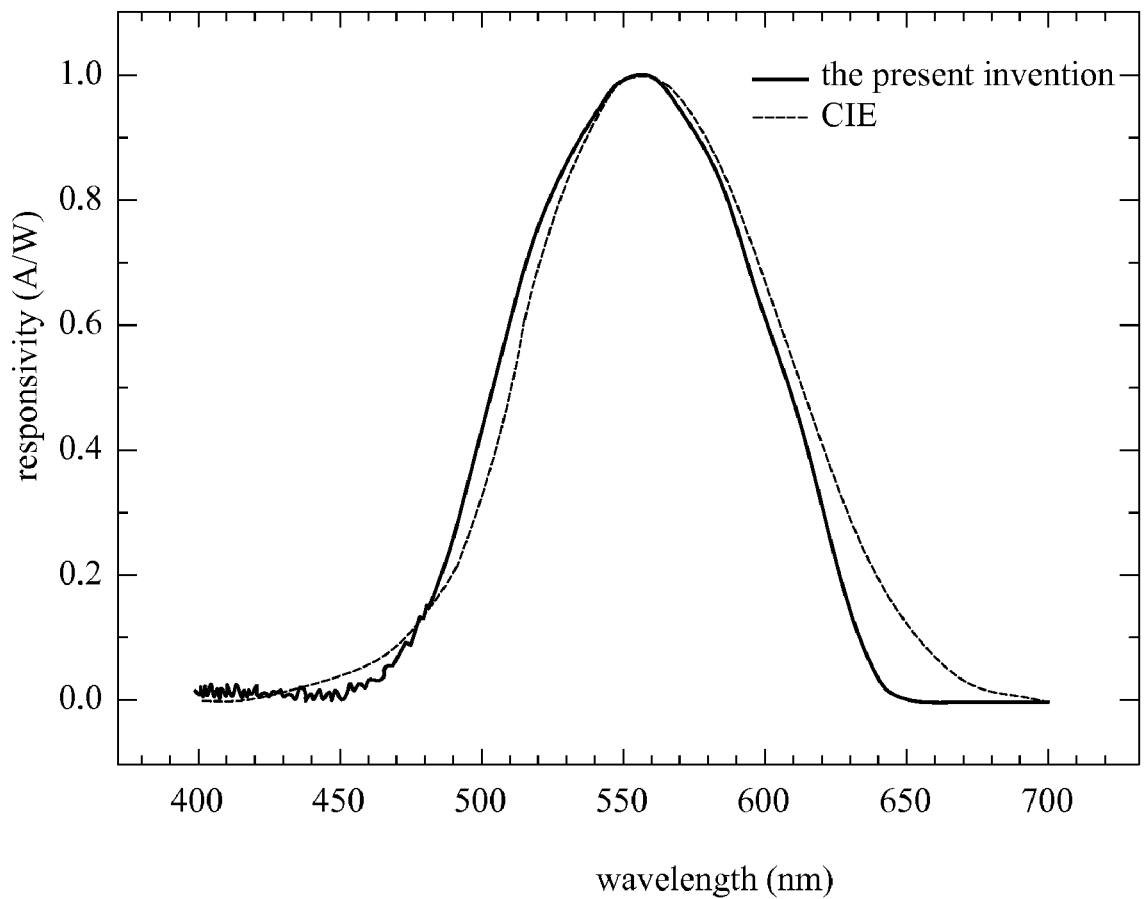
FIG. 2 is a schematic view showing the comparison between the responsivity spectrum of the ambient light sensor according to the present invention and the luminosity function adopted by the CIE.

FIG. 2 shows the comparison between the normalized responsivity spectrum of the ambient light sensor 1 according to the present invention and the CIE luminosity function.

As shown in FIG. 2, the responsivity spectrum of the ambient light sensor 1 according to the present invention is very close to the CIE luminosity function.

What is claimed is:

1. An ambient light sensor, comprising
a substrate;
a buffer layer formed on the substrate, wherein the buffer layer has a doping type;
an absorption layer formed on the buffer layer for absorbing a visible light, and being a PIN (P-type-Intrinsic-N-type) junction, which is made of $Al_xGa_{1-x}As$ (0<x<1), wherein the absorption layer has a compositional graded intrinsic layer made of $Al_yGa_{1-y}As$, where y value gradually changes from 0 to 1;
a filter layer formed on the absorption layer for filtering infrared light and the high-energy photon insensitive to the human eye;
wherein the PIN junction has a first absorption sub-layer; and
wherein the first absorption sub-layer has a doping type that is as same as the doping type of the buffer layer.

2. The ambient light sensor as claimed in claim 1, wherein the PIN junction of the absorption layer further comprises a second absorption sub-layer, a third absorption sub-layer, a fourth absorption sub-layer and a fifth absorption sub-layer, wherein the first absorption sub-layer and the fifth absorption sub-layer are P-type doping or N-type doping, respectively and a doping type of the first absorption sub-layer is different from that of the fifth absorption sub-layer; the second absorption sub-layer, the third absorption sub-layer, and the fourth absorption sub-layer are without doping and the third absorption sub-layer is the intrinsic layer.

3. The ambient light sensor as claimed in claim 2, wherein the filter layer further comprises a first filter sub-layer, a second filter sub-layer and a third filter sub-layer, wherein the first filter sub-layer and the third filter sub-layer are made of GaAs or AlGaAs, whose Al contained is less than that of the fifth absorption layer; and the second filter sub-layer is made of $Al_1Ga_{1-y}As$ (0<z<1).

4. The ambient light sensor as claimed in claim 1, wherein the filter layer and the substrate are P-type doping or N-type doping, respectively, and a doping type of the filter layer is different from that of the substrate.

5. The ambient light sensor as claimed in claim 2, wherein the fifth absorption sub-layer and the filter layer have the same doping type, and the substrate, the buffer layer and the first absorption sub-layer have the same doping type.

6. The ambient light sensor as claimed in claim 3, wherein the third filter sub-layer and the substrate are contact surfaces of bias electrodes.

7. The ambient light sensor as claimed in claim 1, wherein the absorption layer is made of $Al_xGa_{1-x}As$ (0.2<x<0.8).

8. The ambient light sensor as claimed in claim 1, wherein the absorption layer is made of $Al_xGa_{1-x}As$ (0.4<x<0.65).

9. The ambient light sensor as claimed in claim 1, wherein the intrinsic layer is made of $Al_yGa_{1-z}As$ and y value gradually changes from 0.3 to 0.8.

10. The ambient light sensor as claimed in claim 1, wherein the intrinsic layer is made of $Al_yGa_{1-z}As$ and y gradually changes from 0.3 to 0.61.

11. The ambient light sensor as claimed in claim 3, wherein the second filter sub-layer is made of $Al_zGa_{1-z}As$ (0.6<z<0.8).

12. The ambient light sensor as claimed in claim 3, wherein the second filter sub-layer is made of $Al_zGa_{1-z}As$ (0.7<z<0.75).

13. The ambient light sensor as claimed in claim 1, wherein the substrate is N-type doping.

14. The ambient light sensor as claimed in claim 1, wherein thickness of the filter layer is between 50 and 500 nm.

15. The ambient light sensor as claimed in claim 8, wherein the absorption layer is made of $Al_xGa_{1-x}As$ (0.57<x<0.65).

* * * * *